United States Patent
Kim et al.

(10) Patent No.: US 10,908,498 B2
(45) Date of Patent: Feb. 2, 2021

(54) OPTICAL PROXIMITY CORRECTION METHOD AND METHOD OF MANUFACTURING MASK BY USING THE SAME

(71) Applicant: SAMSUNG ELECTRONICS CO., LTD., Suwon-si (KR)

(72) Inventors: Ki-soo Kim, Hwaseong-si (KR); No-young Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 167 days.

(21) Appl. No.: 15/869,457

(22) Filed: Jan. 12, 2018

(65) Prior Publication Data

US 2019/0018325 A1 Jan. 17, 2019

(30) Foreign Application Priority Data

Jul. 13, 2017 (KR) .................. 10-2017-0089169

(51) Int. Cl.
*G03F 1/84* (2012.01)
*G03F 7/20* (2006.01)
*G03F 1/70* (2012.01)
*G03F 1/36* (2012.01)

(52) U.S. Cl.
CPC .................. *G03F 1/84* (2013.01); *G03F 1/36* (2013.01); *G03F 1/70* (2013.01); *G03F 7/705* (2013.01); *G03F 7/70441* (2013.01); *G03F 7/70625* (2013.01)

(58) Field of Classification Search
CPC .......... G03F 1/84; G03F 1/36; G03F 7/70441; G03F 7/70616; G03F 7/705
See application file for complete search history.

(56) References Cited

U.S. PATENT DOCUMENTS

| | | |
|---|---|---|
| 7,015,468 B1 | 3/2006 | Azordegan et al. |
| 7,285,781 B2 | 10/2007 | Cao et al. |
| 7,325,225 B2 | 1/2008 | Tanaka et al. |
| 9,110,384 B2 | 8/2015 | Omori et al. |
| 9,297,649 B2 | 3/2016 | Kawada et al. |
| 9,305,744 B2 | 4/2016 | Ohashi et al. |
| 2005/0022150 A1 | 1/2005 | Liu et al. |
| 2012/0237859 A1 | 9/2012 | Yang et al. |
| 2015/0036914 A1 | 2/2015 | Sekiguchi et al. |

FOREIGN PATENT DOCUMENTS

| | | |
|---|---|---|
| CN | 103631084 A | 3/2014 |
| JP | 2005-037255 A | 2/2005 |
| JP | 2009-288497 A | 12/2009 |
| JP | 2012-173225 A | 9/2012 |
| JP | 2013-068864 A | 4/2013 |
| KR | 10-2009-0053558 A | 6/2009 |
| KR | 10-2009-0069093 A | 6/2009 |

OTHER PUBLICATIONS

Japanese Office action dated Dec. 1, 2020 for corresponding JP Patent Application No. 2018-125938.

*Primary Examiner* — Daborah Chacko-Davis
(74) *Attorney, Agent, or Firm* — Lee IP Law, P.C.

(57) ABSTRACT

An optical proximity correction (OPC) method includes preparing basic data for OPC, measuring with a scanning electron microscope (SEM) an after development inspection (ADI) critical dimension (CD) of a photoresist (PR) pattern with respect to a sample, measuring with the SEM an after cleaning inspection (ACI) CD of a wafer pattern formed using the PR pattern, generating CD data of the sample reflecting PR shrinking caused by the SEM measurement by using the measured ADI CD of the PR pattern and the measured ACI CD of the wafer pattern; and generating an OPC model based on the basic data and the CD data of the sample.

20 Claims, 18 Drawing Sheets

FIG. 9

|  | PTD | SEM PTD |
|---|---|---|
| 1D RMS | 0.56 | 0.51 |
| 2D RMS | 1.13 | 1.03 |
| Overall RMS | 0.66 | 0.59 |
| 1D Pass Rate | 91.8 | 93.9 |
| 2D Pass Rate | 96.6 | 98.8 |
| Overall Pass Rate | 94.0 | 96.0 |

OPTICAL PROXIMITY CORRECTION METHOD AND METHOD OF MANUFACTURING MASK BY USING THE SAME

CROSS-REFERENCE TO RELATED APPLICATION

Korean Patent Application No. 10-2017-0089169, filed on Jul. 13, 2017, in the Korean Intellectual Property Office, and entitled: "Optical Proximity Correction Method and Method of Manufacturing Mask by Using the Same," is incorporated by reference herein in its entirety.

BACKGROUND

1. Field

Embodiments relate to a method of manufacturing a mask, and more particularly, to an optical proximity correction (OPC) method and a method of manufacturing a mask by using the OPC method.

2. Description of the Related Art

In a semiconductor manufacturing process, a photolithography process may be performed by using a mask to form a pattern on a semiconductor substrate, e.g., on a wafer or the like. The mask may be defined as a pattern transfer element, where a pattern including an opaque material is formed on a transparent base material.

In a mask manufacturing process, a desired circuit may be first designed, a layout of the circuit may be designed, and design data obtained through optical proximity correction (OPC) may be delivered as mask tape-out (MTO) design data. Subsequently, a mask data preparation (MDP) process may be performed based on the MTO design data, and a mask may be manufactured by performing a front-end-of-line (FEOL) process and a back-end-of-line (BEOL) process.

SUMMARY

According to an aspect of embodiments, there is provided an OPC method including preparing basic data for OPC, measuring, by a scanning electron microscope (SEM), an after development inspection (ADI) critical dimension (CD) of a photo resist (PR) pattern and an after cleaning inspection (ACI) CD of a wafer pattern formed using the PR pattern, with respect to a sample, and generating CD data of the sample reflecting PR shrinking caused by SEM measurement by using the ADI CD of the PR pattern and the ACI CD of the wafer pattern, and generating an OPC model based on the basic data and the CD data of the sample.

According to another aspect of embodiments, there is provided an OPC method including preparing basic data for OPC, measuring, by a scanning electron microscope (SEM), an after development inspection (ADI) critical dimension (CD) of a photo resist (PR) pattern and an after cleaning inspection (ACI) CD of a wafer pattern formed using the PR pattern, with respect to a sample, correcting the ADI CD of the PR pattern by using the ACI CD of the wafer pattern to generate CD data of the sample, generating an OPC model based on the basic data and the CD data of the sample, checking and selecting the OPC model, verifying the OPC model, and performing a simulation by using the OPC model.

According to yet another aspect of embodiments, there is provided a method of manufacturing a mask, the method including performing an OPC method including measuring, by an SEM, an ADI CD of a PR pattern and an ACI CD of a wafer pattern formed using the PR pattern, with respect to a sample, and generating an OPC model reflecting PR shrinking caused by SEM measurement by using the ADI CD of the PR pattern and the ACI CD of the wafer pattern, and delivering design data acquired through the OPC method as mask tape-out (MTO) design data, preparing mask data based on the MTO design data, and performing exposure on a substrate for a mask, based on the mask data.

According to still another aspect of embodiments, there is provided a method of manufacturing a semiconductor device, the method including performing an OPC method including measuring, by an SEM, an ADI CD of a PR pattern and an ACI CD of a wafer pattern formed using the PR pattern, with respect to a sample, and generating an OPC model reflecting PR shrinking caused by SEM measurement by using the ADI CD of the PR pattern and the ACI CD of the wafer pattern, and delivering design data acquired through the OPC method as MTO design data, preparing mask data based on the MTO design data, performing exposure, development, and etching process on a substrate for a mask, based on the mask data, to manufacture a mask, and manufacturing a semiconductor device through a lithography process using the mask.

BRIEF DESCRIPTION OF THE DRAWINGS

Features will become apparent to those of skill in the art by describing in detail exemplary embodiments with reference to the attached drawings, in which:

FIG. 9 illustrates a table for comparing an OPC model generated by a comparative method with an OPC model generated by the OPC method of FIG. 1;

DETAILED DESCRIPTION

Figure 1:
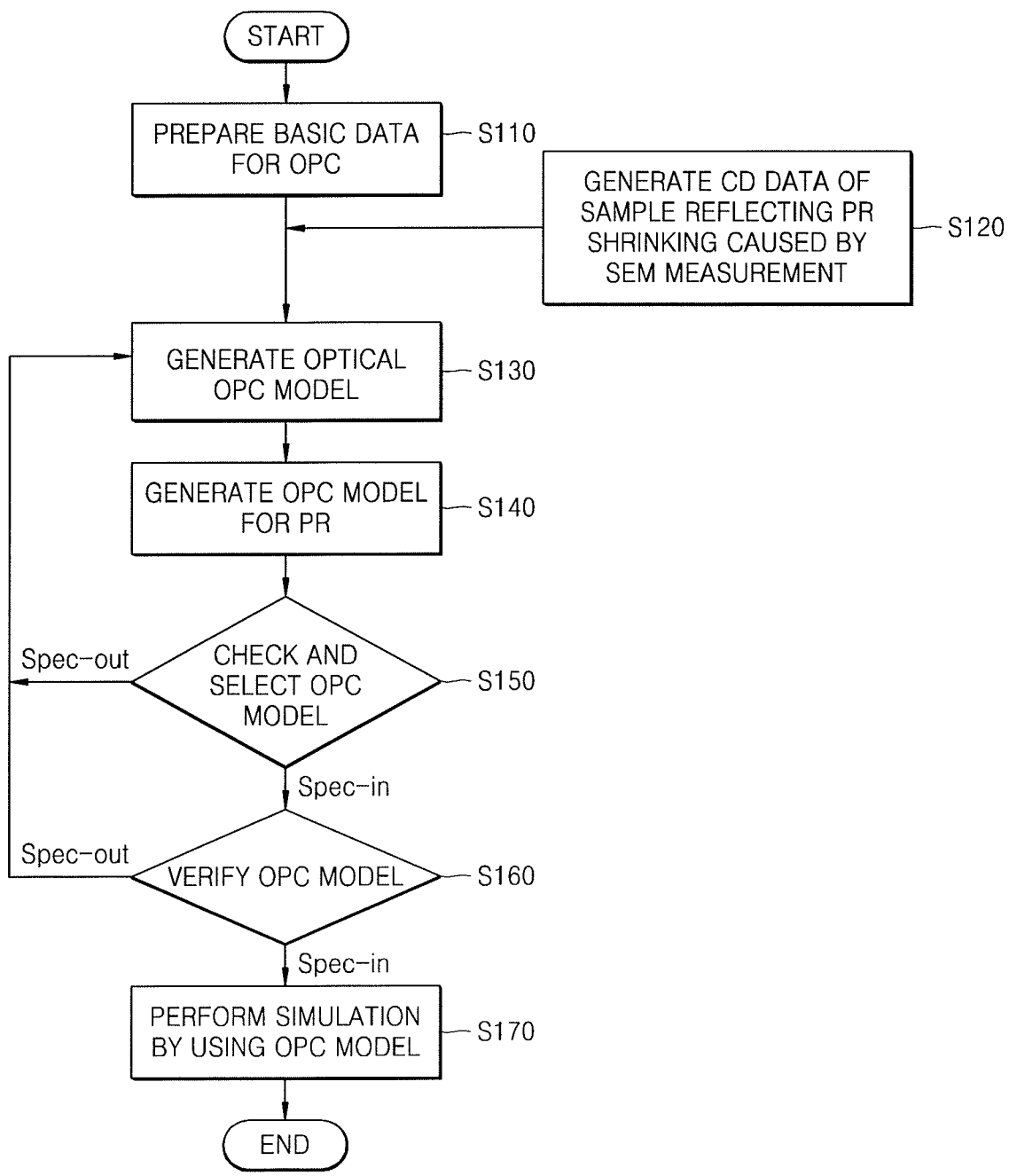
FIG. 1 illustrates a flowchart of an optical proximity correction (OPC) method according to an embodiment.

FIG. 1 is a flowchart illustrating operations of an optical proximity correction (OPC) method according to an embodiment.

Referring to FIG. 1, basic data for OPC is prepared (operation S110), e.g., the basic data preparation may include measurement of patterns on a wafer or on a computer screen via analog or computer tools. The basic data may include data, e.g., information, on a form of patterns of a sample (e.g., type or shape of patterns on a substrate), location of the patterns of the sample (e.g., position of the patterns on a substrate), a type of measurement (e.g., a measurement of space or line of the patterns), and a basic measurement value. In addition, the basic data may include additional information, e.g., a thickness of a photoresist (PR), a refractive index of the PR, and a dielectric constant of the PR, and may include a source map for an illumination system type. However, the basic data is not limited to the above-exemplified data.

For reference, as a pattern is minimized, an optical proximity effect (OPE) may be caused by an influence between adjacent patterns in an exposure process. Thus, the OPC method refers to a method that corrects a layout of a pattern to prevent the OPE from occurring. The OPC method may be largely categorized into a rule-based OPC method and a simulation-based or model-based OPC method. For example, the OPC method according to the present embodiment may be the model-based OPC method. The model-based OPC method uses only measurement results of representative patterns without needing to measure a large number of (or all of) the test patterns, thereby being advantageous in terms of time and cost.

The OPC method may include a method of adding sub-lithographic features called serifs to corners of a pattern or a method of adding sub-resolution assist features (SRAFs) such as scattering bars, in addition to modification of a layout of a pattern. Here, the serifs may be tetragonal features respectively positioned in corners of a pattern, and may be used to sharpen corners of a pattern or compensate for a distortion factor caused by intersection of patterns. The SRAF may be an auxiliary feature introduced to solve an OPC deviation caused by a density difference between patterns, and may be a feature which is formed to have a size less than a resolution of exposure equipment and is not transferred onto a resist layer.

Next, referring back to FIG. 1, critical dimension (CD) data of a sample reflecting PR shrinking due to scanning electron microscope (SEM) measurement is generated (operation S120).

Generally, the OPC method includes measuring the CD of patterns in a sample by using a SEM, generating an OPC model based on CD data of the sample obtained by the measuring, and performing a simulation by using the OPC model to thereby acquire mask design data close to actual measurement data, which are sequentially performed. However, when measuring the CD of the sample through the SEM, energy due to an electron beam (E-beam) is applied to PR, causing shrinking of the PR, and thus, an error in the CD data of the sample obtained by the SEM measurement due to the shrinking of the PR may occur.

The error in the CD data of the sample may include an error due to PR pattern deformation and/or detection signal distortion. Thus, when the OPC model is generated using the CD data of the sample, obtained by the SEM measurement, as it is, an error may occur in the OPC model, due to the error in the CD data of the sample. As a result, an error may occur in the OPC method, i.e., an error may occur in the simulation using the OPC model. PR shrinking occurring when measuring the CD of a PR pattern through the SEM and a difference between the CD of an actual PR pattern and the CD of the PR pattern measured by the SEM will be described in more detail with reference to FIGS. 3 to 4B below.

In contrast, in the OPC method according to the present embodiment, the above-described problem may be solved by generating CD data of a sample reflecting PR shrinking due to the SEM measurement. A detailed process of generating CD data of a sample reflecting PR shrinking due to the SEM measurement will be described in more detail with reference to FIGS. 2A to 5D below. For reference, in the existing OPC method, CD data of a sample is corrected from an empirical point of view and the corrected CD data is used for generation of an OPC model, i.e., OPC modelling. However, slightly different results may be obtained from the same sample CD data, and there is no clear criterion for correcting an error in CD data of a sample. Thus, there is a limit in improving the accuracy of the CD data of the sample.

The operation (operation S110) of preparing the basic data and the operation (operation S120) of generating the CD data of the sample may be performed in any order. For example, the operation (operation S110) of preparing the basic data may be performed first, or the operation (operation S120) of generating the CD data of the sample may be performed first.

After preparing the basic data (S110) and generating the CD data of the sample (S120), an optical OPC model is generated (operation S130). The generation of the optical OPC model may include optimization of a defocus start (DS) position and a best focus (BF) position in an exposure process. In addition, the generation of the optical OPC model may include optimization of an optical state of exposure equipment itself or a light diffraction phenomenon. However, the generation of the optical OPC model is not limited thereto. For example, the generation of the optical OPC model may include various processes related to an optical phenomenon in the exposure process. In generating the optical OPC model, the CD data of the sample described above may be used.

After the generation of the optical OPC model, an OPC model for the PR is generated (operation S140). The generation of the OPC model for the PR may include optimization of a threshold value of the PR. Here, the threshold value of the PR denotes a threshold value at which a chemical change occurs in the exposure process. For example, the threshold value may be given as an intensity of exposure light. The generation of the OPC model for the PR may also include selecting an appropriate model form from among various PR model forms. Here, each of the PR model forms may be a composition of the chemical properties of the PR. For example, a first PR model form may include chemical properties 1, 2, and 3, and a second PR model form may include chemical properties 1, 3, and 4. For example, also in generating the OPC model for the PR, the CD data of the sample described above may be used.

The optical OPC model and the OPC model for the PR are collectively referred to as an OPC model. Thus, a process of generating the optical OPC model and a process of generating the OPC model for the PR may be collectively referred to as a process of generating the OPC model, i.e., an OPC modelling process. Hereinafter, unless otherwise stated, the OPC model is used to refer to an integral model including the optical OPC model and the OPC model for the PR.

After the generation of the OPC model, the OPC model is checked and is selected (operation S150). The check of the OPC model may be done, for example, through root mean square (RMS) calculation for a CD error. After the check of the OPC model, the OPC model is selected. More specifically, first, the RMS calculation for the CD error is performed on the generated OPC model, and it is checked whether an RMS value obtained through the RMS calculation is within a set specification. If the RMS value is within the specification (Spec-in), the generated OPC model is selected. If the RMS value deviates from the specification (Spec-out), the generated OPC model is discarded and an operation of generating another OPC model, i.e., the operation (operation S130) of generating the optical OPC model, is performed again.

When an OPC model is selected, the selected OPC model is verified (operation S160). The verification of the OPC model may be done by applying the OPC model to patterns different from patterns used in the generation of the OPC model. When the OPC model is applied to the different patterns and the result is substantially the same (Spec-in), the verification of the OPC model is completed. When the same result is not obtained (Spec-out), an operation of generating another OPC model, i.e., the operation (operation S130) of generating the optical OPC model, is performed again.

When the verification of the OPC model is completed, a simulation is performed using the OPC model (operation S170). Through the simulation using the OPC model, mask design data close to actual measurement data may be obtained. The mask design data may be transferred to a mask production team as Mask Tape-Out (MTO) design data for mask production.

The OPC method according to the present embodiment may improve the accuracy of the OPC model and thereby optimize the OPC method by generating CD data of a sample reflecting PR shrinking caused by SEM measurement and using the CD data of the sample for OPC modelling. In addition, the OPC method according to the present embodiment may provide a clear criterion for correcting an error in the CD data of the sample due to the PR shrinking due to the SEM measurement, by reflecting the PR shrinking due to the SEM measurement in the CD data of the sample according to a predetermined rule. A method of reflecting the PR shrinking caused by the SEM measurement in the CD data of the sample according to a predetermined rule will be described below in more detail with reference to FIGS. 2A to 5D.

Figure 2A:
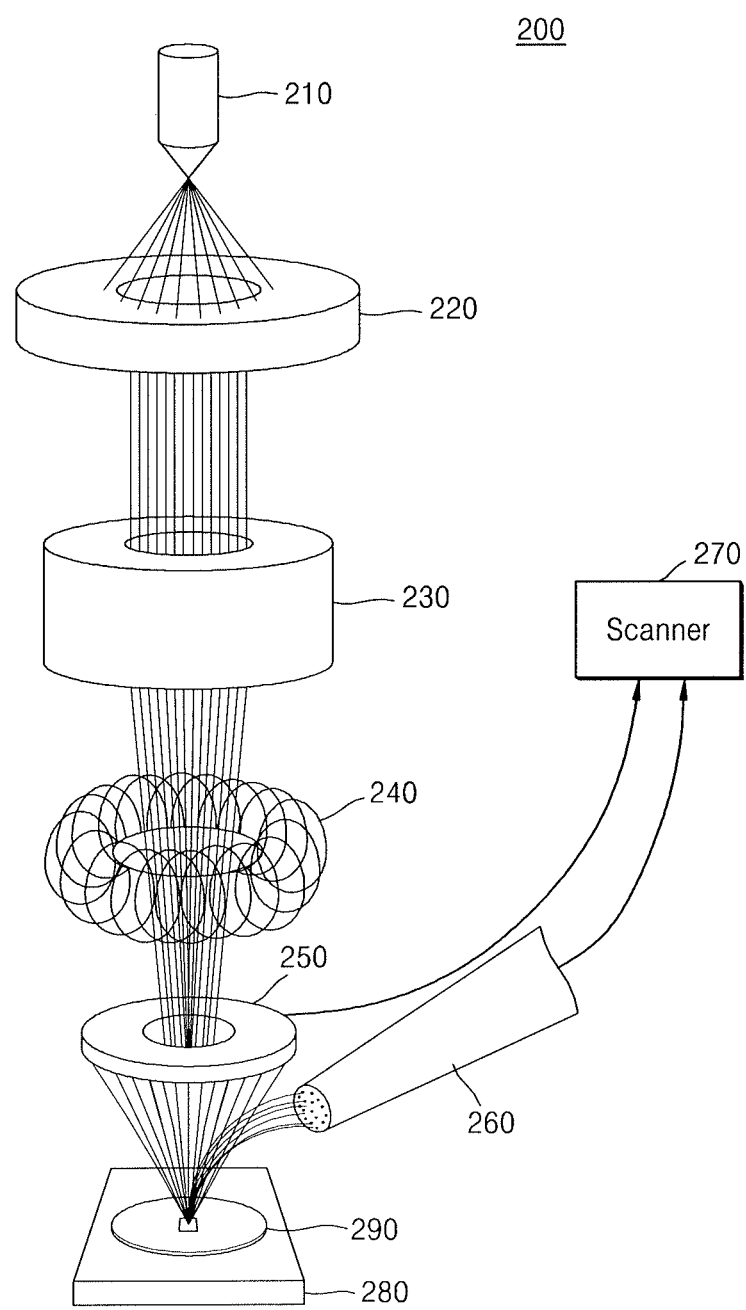
FIG. 2A illustrates a schematic configuration diagram of a scanning electron microscope (SEM) used in the OPC method according to an embodiment.
Figure 2B:
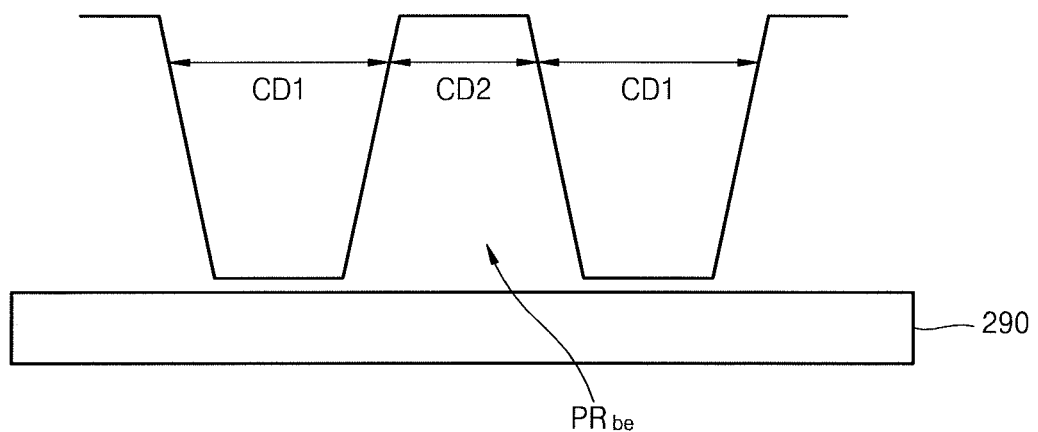
FIGS. 2B and 2C illustrate conceptual diagrams of a phenomenon that occurs when a critical dimension (CD) of a PR pattern is measured using the SEM of FIG. 2A.
Figure 2C:
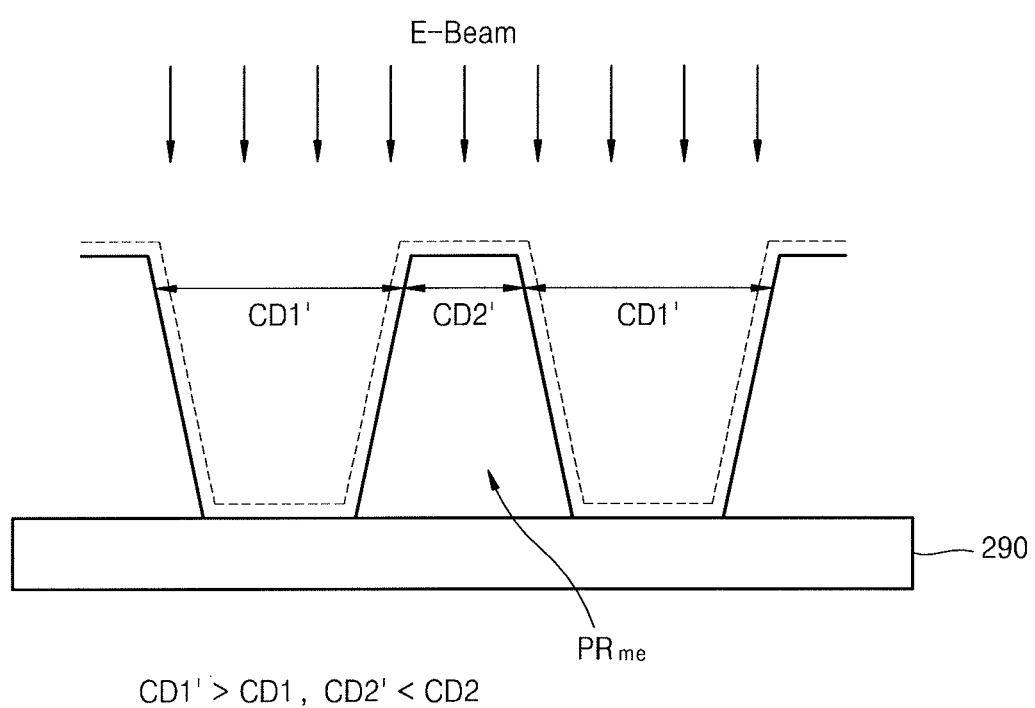

FIG. 2A is a schematic configuration diagram of a SEM 200 used in the OPC method according to the present embodiment, and FIGS. 2B and 2C are conceptual diagrams illustrating a phenomenon that occurs when the CD of a PR pattern is measured by using the SEM 200 of FIG. 2A.

Referring to FIGS. 2A to 2C, as described above, in order to generate CD data of a sample, the CD of PR patterns in the sample may be measured by the SEM 200. The SEM 200 may include an electron gun 210, an anode 220, a magnetic lens 230, a scanning coil 240, a first detector 250, a second detector 260, a scanner 270, and a stage 280.

The electron gun 210 may be, for example, a Schottky electron gun or a thermoelectric-emissive electron gun. An electron beam may be emitted by applying an accelerating voltage to the electron gun 210. The anode 220 is an accelerating electrode, and the electron beam is accelerated by a voltage applied between the electron gun 210 and the anode 220. The magnetic lens 230 may function to focus and accelerate the electron beam. The scanning coil 240 may one-dimensionally or two-dimensionally scan the electron beam on a specimen, i.e., a sample wafer 290. The first detector 250 detects electrons back-scattered as the electron beam is radiated onto the sample wafer 290, and the second detector 260 detects secondary electrons generated from the sample wafer 290 by electron beam radiation. The scanner 270 may analyze detection signals for electrons detected by the first and second detectors 250 and 260 to generate an image for a PR pattern or a wafer pattern on the sample wafer 290. Also, the scanner 270 may control a scanning direction of electron beams by applying a high frequency control signal to the scanning coil 240.

The stage 280 is a place where the sample wafer 290 is placed, and the sample wafer 290 may be placed on the upper surface of the stage 280. The stage 280 may move the sample wafer 290 in the x direction, the y direction, or the z direction through linear movement in the x direction, the y direction, or the z direction. Although not shown, an objective lens may be placed directly above the stage 280, and the objective lens may converge an electron beam deflected by the scan coil 240 on the upper surface of the sample wafer 290.

FIG. 2B illustrates a cross-section of a PR pattern $PR_{be}$ in a form of a line-and-space formed on the sample wafer 290, e.g., the PR pattern $PR_{be}$ may include a plurality of trapezoidal patterns on the sample wafer 290 that are spaced apart from each other. FIG. 2B illustrates the form of the PR pattern $PR_{be}$ before the CD measurement via the SEM 200 is performed. The PR pattern $PR_{be}$ may have a first CD CD1 in a space portion, e.g., the spaces between the adjacent trapezoidal patterns, and a second CD CD2 in a line portion, e.g., the trapezoidal patterns. In the PR pattern $PR_{be}$ of FIG. 2B, the space portion is narrowed downward, e.g., reverse trapezoidal cross-section, and the line portion is widened downward, e.g., trapezoidal cross-section. The structure of the PR pattern $PR_{be}$ is not limited thereto. For example, a side surface of the space portion or the line portion may have a substantially vertical profile, e.g., quadrangular cross section, or may have a structure opposite to the structure of FIG. 2B, based on the material of PR forming the PR pattern $PR_{be}$ or exposure conditions in an exposure process.

FIG. 2C illustrates a cross-section of a PR pattern $PR_{me}$ when performing CD measurement via the SEM 200. In the CD measurement by the SEM 200, an electron beam (E-beam) may be scanned on the PR and energy of the electron beam may be applied to the PR. The energy applied to the PR may shrink the PR and may cause a change in the PR pattern $PR_{me}$. For example, due to shrinking of the PR, the width of a space portion of the PR pattern $PR_{me}$ may be widened, and the width of the line portion thereof may be narrowed. In FIG. 2C, a dotted line indicates a state before the PR shrinks and a solid line indicates a state after the PR shrinks. In other words, in FIG. 2C, a first CD CD1' of the space portion measured by the SEM 200 may be greater than the first CD CD1 of an initial space portion before the measurement (in FIG. 2B), and a second CD CD2' of the line portion measured by the SEM 200 may be smaller than a second CD CD2 of an initial line portion before the measurement (in FIG. 2B). Thus, a CD of a PR pattern measured by the SEM 200 may have an error corresponding to a difference between a CD of an initial PR pattern before the measurement by the SEM 200 (CD1/CD2) and a CD of a PR modified by the measurement of the SEM 200 (CD1'/CD2'). When a CD of a PR pattern having such an error is used as CD data of a sample, errors in OPC modelling, and consequent errors in an OPC method, may result.

Figure 3:
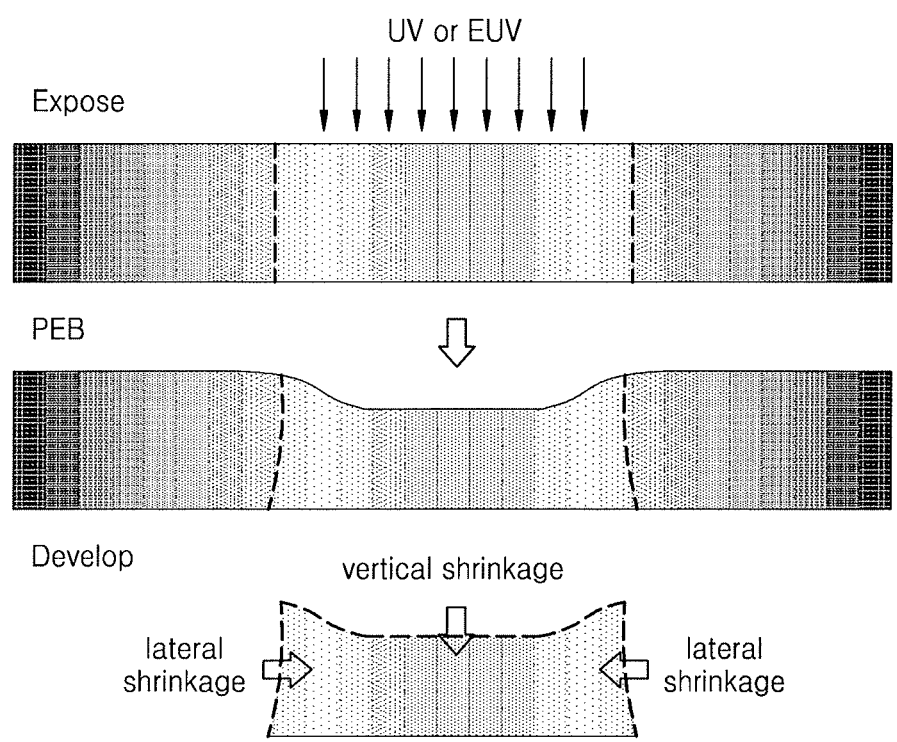
FIG. 3 illustrates a conceptual diagram of a phenomenon occurring in an exposure process for negative tone development (NTD) PR.

FIG. 3 is a conceptual diagram illustrating a phenomenon occurring in an exposure process for negative tone development (NTD) PR. The NTD PR denotes PR in which a portion not exposed in a development process is removed and an exposed portion is maintained. Positive tone development (PTD) PR, which is the opposite of the NTD PR, denotes a PR in which an exposed portion is removed by a development process.

Referring to FIG. 3, an exposure process is performed by radiating ultraviolet (UV) or extreme UV (EUV) light onto the NTD PR ("Expose"). Next, after the exposure process, a baking process is performed through heat treatment ("Post Exposure Bake (PEB)"). And then, a development process is performed to remove an unexposed NTD PR portion and leave an exposed NTD PR portion ("Develop"). When energy is applied to an NTD PR portion in the exposure process and the baking process, the NTD PR shrinks. As shown in FIG. 3, lateral shrinking and vertical shrinking may occur in the remaining NTD PR portion. Thus, in the case of the NTD PR, due to the fact that PR shrinking occurs according to energy application, it may be sufficiently predicted that PR shrinking may occur due to energy application of an electron beam also during CD measurement by an SEM.

For reference, in the PEB process, energy may also be applied to an unexposed portion by heat treatment to thereby cause PR shrink. However, chemical characteristics of the unexposed portion are different from those of the exposed portion, and thus, a PR shrinking phenomenon in the unexposed portion may be different from that in the exposed portion. However, because the unexposed portion is removed, the PR shrinking in the unexposed portion is not shown.

Incidentally, in the case of the PTD PR, an exposed portion is removed in a development process, and an unexposed portion remains to form a PR pattern. From the viewpoint of energy application, a PR pattern formed from the PTD PR may correspond to a state wherein a relatively low energy is applied to the PTD PR, compared with a PR pattern generated from the NTD PR. In other words, the PR pattern formed from the NTD PR is a portion to which energy is applied in the exposure process, whereas the PR pattern formed from the PTD PR is a portion to which energy is not applied in the exposure process. Shrinking of the PR may be relatively large in the state of initial energy application and then may gradually decrease. As a result, it may be predicted that a relatively large PR shrinking may occur in the CD measurement by using the SEM performed on the PR pattern generated from the PTD PR rather than in the CD measurement by using the SEM performed on the PR pattern generated from the NTD PR.

Figure 4:
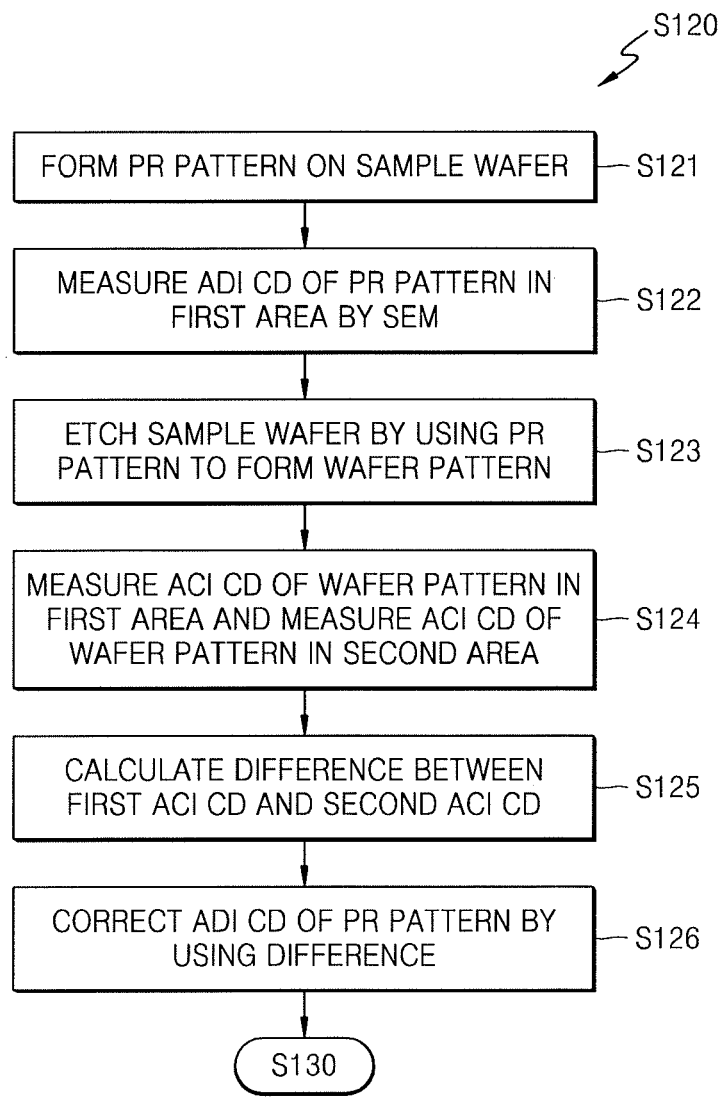
FIG. 4 illustrates a detailed flowchart of generating CD data of a sample, shown in FIG. 1.

FIG. 4 is a flowchart illustrating in more detail the operation (operation S120) of generating CD data of a sample, shown in FIG. 1, and FIGS. 5A to 5D are cross-sectional views illustrating a process of measuring an After Develop Inspection (ADI) CD of a PR pattern and an After Cleaning Inspection (ACI) CD of a wafer pattern in the operation of FIG. 4. The descriptions already provided above with reference to FIG. 1 will be only briefly described or omitted.

Figure 5A:
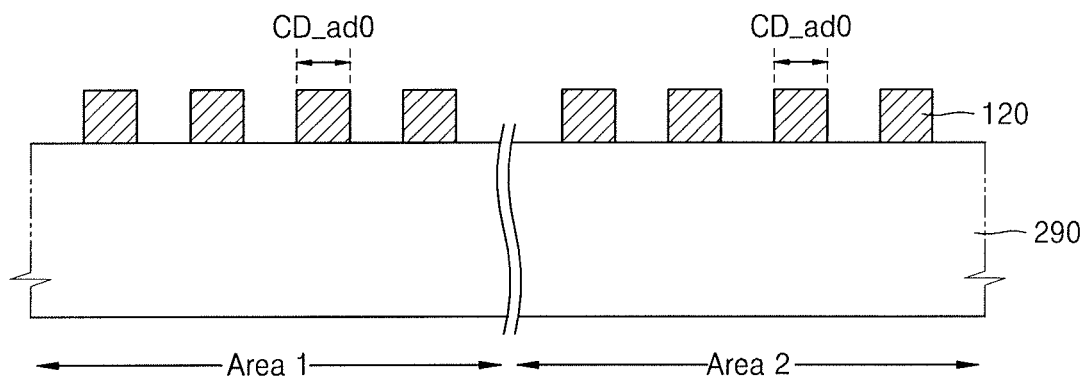
FIGS. 5A to 5D illustrate cross-sectional views of stages in a process of measuring an after cleaning inspection (ACI) CD of a PR pattern and an ACI CD of a wafer pattern in the operation of generating the CD data of a sample, shown in FIG. 4.

Referring to FIGS. 4 and 5A, a PR pattern 120 is formed on the sample wafer 290 (operation S121). The sample wafer 290 and the PR pattern 120 may correspond to one sample. The PR pattern 120 may be formed through an exposure process and a development process after the sample wafer 290 is coated with PR. The PR pattern 120 may be formed from NTD PR or PTD PR. The PR pattern 120 may be formed in a form of a line-and-space. The line-and-space may extend in a direction towards or away from a paper plane. After the PR pattern 120 is initially formed, a line portion of the PR pattern 120 may have an initial CD CD_ad0. The initial CD CD_ad0 corresponds to a CD value of a line portion of an actual PR pattern 120 as a CD value before measurement by the SEM, i.e., the initial CD CD_ad0 corresponds to a horizontal distance between two opposite sidewalls of a same line pattern 120 (FIG. 5A). However, the initial CD CD_ad0 cannot be confirmed through physical measurements.

The sample may be divided into a first area Area1 and a second area Area2. The first area Area1 may be an area where the CD of PR patterns therein is measured by an SEM, and the second area Area2 may be an area where the CD of PR patterns therein is not measured by the SEM. A plurality of PR patterns that are the same may be included in each of the first and second areas Area1 and Area2. As shown in FIG. 5A, before the CD measurement by the SEM, the CD of a line portion of a PR pattern 120 in the first area Area1 and the CD of a line portion of a PR pattern 120 in the second area Area2 may be equal to each other as the initial CD CD_ad0.

Figure 5B:
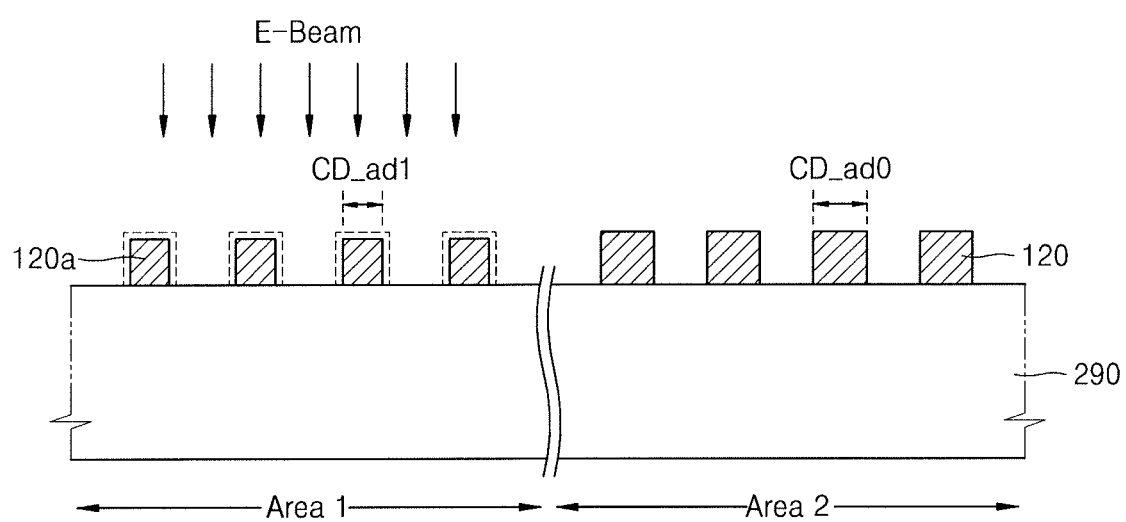

Referring to FIGS. 4 and 5B, after the PR pattern 120 is formed, an ADI CD of a line portion of a PR pattern 120a is measured, e.g., only, in the first area Area1 of the sample by the SEM (operation S122). In general, CD measurement for a PR pattern is referred to as ADI CD measurement because the PR pattern is formed through a development process and CD measurement for the PR pattern is performed after the development process. On the other hand, CD measurement for a pattern formed in a wafer or a material film on the wafer through etching is referred to as ACI CD measurement or after etch inspection (AEI) CD measurement. Here, ACI is a term made because cleaning is usually performed after etching and CD measurement for a wafer pattern or a material film pattern is performed after cleaning.

As can be seen from a dotted line and a solid line in FIG. 5B, the shrinking of PR may be caused by ADI CD measurement by the SEM. That is, the dotted line indicates a state before the occurrence of the PR shrinking, and the solid line indicates a state after the occurrence of the PR shrinking. Accordingly, the line portion of the PR pattern 120a may have an ADI CD CD_ad1 before correction, i.e., CD_ad1 (solid line in FIG. 5B) corresponds to a horizontal distance between two opposite sidewalls of a same shrunk line pattern 120a (FIG. 5B) after performing the ADI CD measurement by the SEM.

The ADI CD CD_ad1 before correction, i.e., after ADI CD measurement by the SEM, may be smaller than the initial CD CD_ad0. For example, as illustrated in FIG. 5B, after the E-beam is irradiated only to Area 1, e.g., among Area 1 and Area 2, by the SEM, the line portion of the PR pattern 120a may have an ADI CD CD_ad1, which is smaller than the initial CD CD_ad0 in Area 2 (which was not irradiated).

Figure 5C:
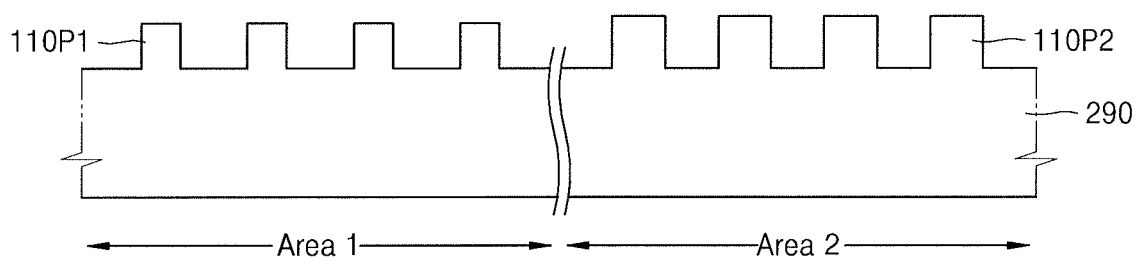

Referring to FIGS. 4 and 5C, after the ADI CD of the PR pattern 120a in the first area Area1 is measured, the sample wafer 290 is etched using the PR patterns 120a in Area 1 and the PR patterns 120 in Area 2 to form wafer patterns (operation S123). The resultant wafer patterns may include a first wafer pattern 110P1 in the first area Area1 and a second wafer pattern 110P2 in the second area Area1. In detail, the first wafer pattern 110P1 may be formed by using the PR pattern 120a of the first area Area1 as a mask, and the second wafer pattern 110P2 may be formed by using the PR pattern 120 of the second area Area2 as a mask. Thus, the width of a line portion of the first wafer pattern 110P1 may be less than the width of a line portion of the second wafer pattern 110P2.

The widths of the line portions of the PR pattern 120a and the first wafer pattern 110P1 in the first area Area1 may not coincide with each other depending on etching process conditions. In addition, the widths of the line portions of the PR pattern 120 and the second wafer pattern 110P2 in the second area Area2 may not coincide with each other. However, if an etching process condition in the first area Area1 is the same as that in the second area Area2, the width of a line portion of a wafer pattern formed by a line portion of a PR pattern with a narrow width may be less than the width of a line portion of a wafer pattern formed by a line portion of a PR pattern with a wide width. Thus, the width of the line portion of the first wafer pattern 110P1 may be less than the width of the line portion of the second wafer pattern 110P2, i.e., in correspondence with respective patterns 120a and 120.

Figure 5D:
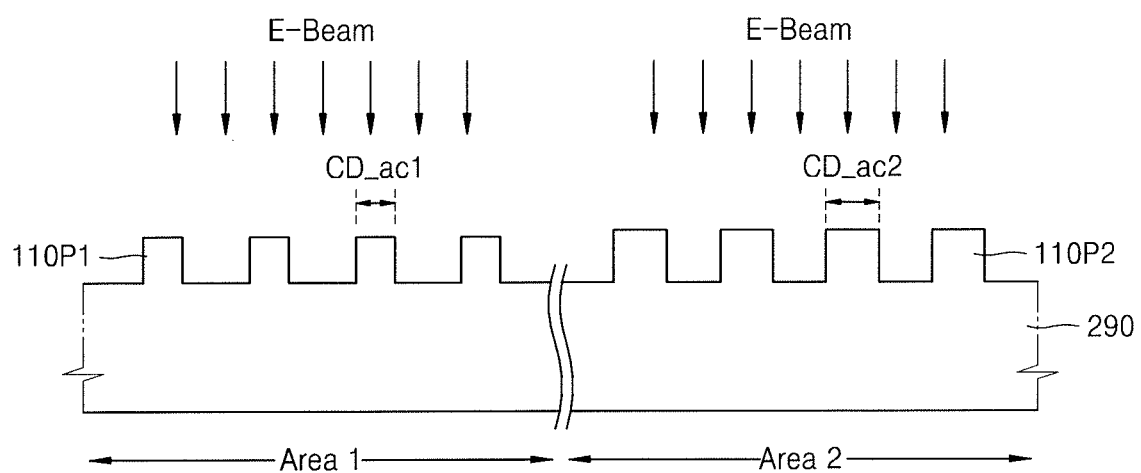

Referring to FIGS. 4 and 5D, after the wafer patterns 110P1 and 110P2 are formed, an ACI CD of a wafer pattern in the first area Area1, i.e., the first wafer pattern 110P1, is measured and an ACI CD of a wafer pattern in the second area Area2, i.e., the second wafer pattern 110P2, is measured (operation S124). ACI CD measurement for the first wafer pattern 110P1 and ACI CD measurement for the second wafer pattern 110P2 may be performed by a SEM. However, since the material of the first and second wafer patterns 110P1 and 110P2 is a semiconductor material, e.g., silicon, shrinking of the sample wafer 290, i.e., of the first and second wafer patterns 110P1 and 110P2, may hardly occur, e.g., is negligible, during the process of measuring an ACI CD of a wafer pattern by using the SEM. Nevertheless, the possibility of shrinking of the sample wafer 290 in the process of measuring an ACI CD of a wafer pattern by using the SEM is not completely excluded.

Through the ACI CD measurement for the first wafer pattern 110P1, a first ACI CD CD_ac1 of the line portion of the first wafer pattern 110P1 may be obtained. Furthermore, through the ACI CD measurement for the second wafer pattern 110P2, a second ACI CD CD_ac2 of the line portion of the second wafer pattern 110P2 may be obtained. As described above, the width of the line portion of the first wafer pattern 110P1 may be less than the width of the line portion of the second wafer pattern 110P2, due to a difference between the PR patterns 120a and 120. Thus, the first ACI CD CD_ac1 may be less than the second ACI CD CD_ac2.

Referring to FIG. 4, after the ACI CD measurement for the first wafer pattern 110P1 and the second wafer pattern 110P2, a difference between the first ACI CD CD_ac1 and the second ACI CD CD_ac2 is calculated (operation S125), e.g., by subtracting one value from the other: ΔCD=(CD_ac1)−(CD_ac2). It may be understood that the difference between the first ACI CD CD_ac1 and the second ACI CD CD_ac2 is due to the ADI CD measurement by the SEM on the PR pattern 120a of the first area Area1.

Referring to FIG. 4, after the calculation of the difference between the first ACI CD CD_ac1 and the second ACI CD CD_ac2, the ADI CD of a PR pattern is corrected using the difference between the first ACI CD CD_ac1 and the second ACI CD CD_ac2 (operation S126). For example, the difference between the first ACI CD CD_ac1 and the second ACI CD CD_ac2 is reflected in the ADI CD of a PR pattern obtained through the measurement by the SEM, i.e., the ADI CD CD_ac1 before the correction, and thus, an error in the ADI CD of the PR pattern, caused by PR shrinking caused by the SEM measurement, may be corrected. Accordingly, a corrected ADI CD CD_co of the PR pattern, which approximates the initial CD CD_ad0 of the PR pattern, may be obtained. In other words, as the corrected ADI CD CD_co of the PR pattern approximates the initial CD CD_ad0 of the PR pattern, i.e., CD_co equals approximately the value of CD_ad0 before irradiation, ΔCD may be used to calculate the corrected ADI CD CD_co of the PR pattern.

A method of obtaining the corrected ADI CD CD_co of the PR pattern is expressed by Equation 1.

$$CD\_ad0 \approx CD\_co = CD\_ad1 + \Delta \qquad \text{Equation 1}$$

In this case, CD_ad0 is the initial CD of the PR pattern (see FIG. 5A), CD_co is the corrected ADI CD of the PR pattern, CD_ad1 is the ADI CD before correction of the PR pattern, Δ is the difference (i.e., CD_ac2−CD_ac1) between the first ACI CD CD_ac1 and the second ACI CD CD_ac2, wherein Δ may be positive (+) or negative (−) depending on whether CD measured by using the SEM corresponds to a line portion of the PR pattern or a space portion of the PR pattern. For example, when Equation 1 is used with respect to the line portion of the PR pattern, the ADI CD CD_ad1 before the correction becomes less than the initial CD CD_ad0 due to PR shrinking caused by the SEM measurement. In addition, since the second ACI CD CD_ac2 is greater than the first ACI CD CD_ac1, Δ becomes positive (+). Thus, the corrected ADI CD CD_co becomes greater than the ADI CD CD_ad1 before the correction.

When Equation 1 is used with respect to a space portion of the PR pattern, as can be understood from FIG. 3C in the case of the CD of the spacer portion of the PR pattern, the ADI CD CD_ad1 before the correction becomes greater than the initial CD CD_ad0 due to PR shrinking caused by the SEM measurement. In addition, since the second ACI CD CD_ac2 is less than the first ACI CD CD_ac1, Δ becomes negative (−). Thus, the corrected ADI CD CD_co becomes less than the ADI CD CD_ad1 before the correction.

Although the OPC method according to the present embodiment has been described with one PR pattern in the first area Area1 and a corresponding one PR pattern in the second area Area2, the OPC method according to the present embodiment is not limited thereto. For example, at least two identical PR patterns arranged in different positions in each of the first and second areas Area1 and Area2 may be used to obtain a corrected ADI CD CD_co of a PR pattern, and accordingly, the reliability of a method of obtaining the corrected ADI CD CD_co of the PR pattern may be improved.

More specifically, a plurality of identical PR patterns may be included in different positions in each of the first and second areas Area1 and Area2. ADI CD measurement by the SEM is performed on n (n≥2) PR patterns in the first area Area1. And then, the sample wafer 100 is etched using PR patterns to form wafer patterns, ACI CDs for n wafer patterns, i.e., n first wafer patterns, in the first area Area1 are measured, and ACI CDs for n wafer patterns, i.e., n second wafer patterns, in the second area Area2 are also measured. Next, a corrected ADI CD CD_co of n PR patterns may be obtained based on Equation 1. An accurate corrected ADI CD CD_co may be obtained by obtaining and averaging corrected ADI CDs CD_co of n PR patterns.

In the OPC method according to the present embodiment, in order to improve the reliability of the method of obtaining a corrected ADI CD CD_co of a PR pattern, at least 10 identical PR patterns arranged in different positions in each of the first and second areas Area1 and Area2 may be used.

According to an embodiment, a plurality of different PR patterns may be included in each of the first and second areas Area1 and Area2. In this case, PR patterns having the same form as those of PR patterns included in the first area Area1, respectively, have to be included in the second area Area2. More specifically, when Pattern 1, Pattern 2, and Pattern 3, which are different types of PR patterns, are arranged in the first area Area1, Pattern 1, Pattern 2, and Pattern 3 have to be arranged also in the second area Area2. This is because when ADI CDs of Pattern 1, Pattern 2, and Pattern 3 in the first area Area1 are measured by using the SEM, Pattern 1, Pattern 2, and Pattern 3 have to be present also in the second area Area2 so that an ACI CD of a wafer pattern in the first area Area1 and an ACI CD of a wafer pattern in the second area Area2 may be measured after an etching process to thereby calculate a difference between the measured ACI CDs and a corrected ADI CD of each of the PR patterns.

Although the method of obtaining a corrected ADI CD CD_co of a PR pattern by using a line-and-space type PR pattern has been described with reference to FIGS. 5A to 5D, the method of obtaining a corrected ADI CD CD_co of a PR pattern is not limited thereto. For example, the method of obtaining a corrected ADI CD CD_co may also be applied to a PR pattern having a shape such as a circle, an ellipse, or a polygon. Regardless of whether a PR pattern has a line-and-space shape or a shape such as a circle, an ellipse, or a polygon, a portion like a line portion where a PR is present is shrunk due to SEM measurement and a space portion where a PR is not present is enlarged due to SEM measurement. Thus, the method of obtaining a corrected ADI CD CD_co of a PR pattern, which is applied to the OPC method according to the present embodiment, may be generally applied regardless of the shape of the PR pattern.

Figure 6A:
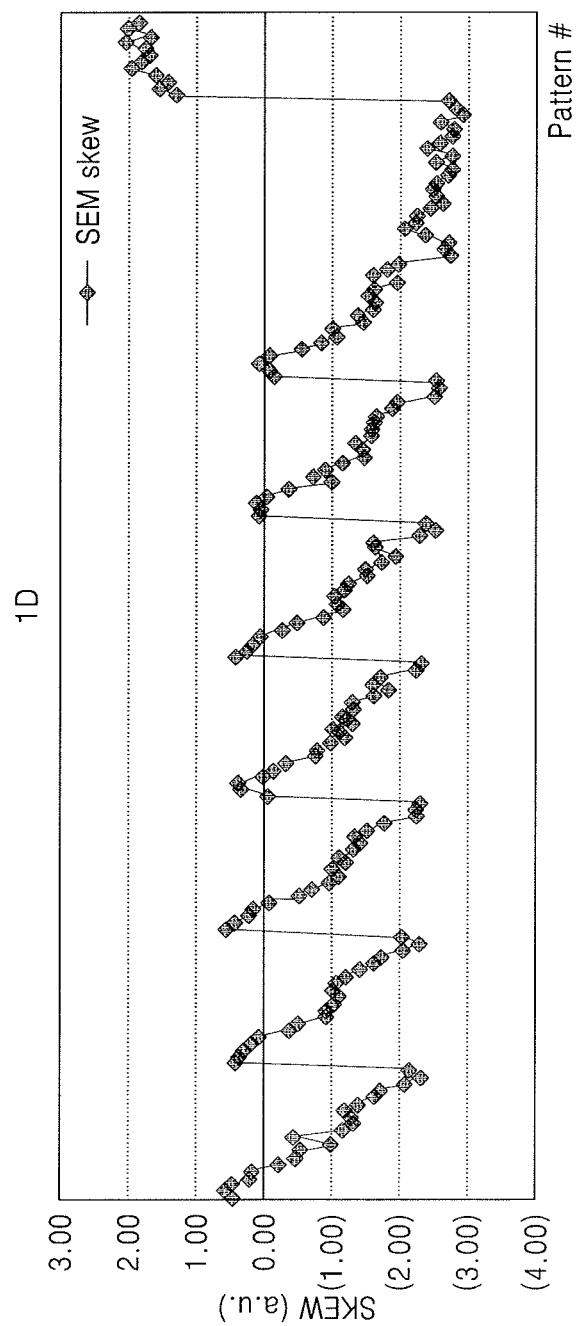
FIGS. 6A to 6C illustrate graphs of SEM skew data applied to the OPC method of FIG. 1 for various patterns.
Figure 6B:
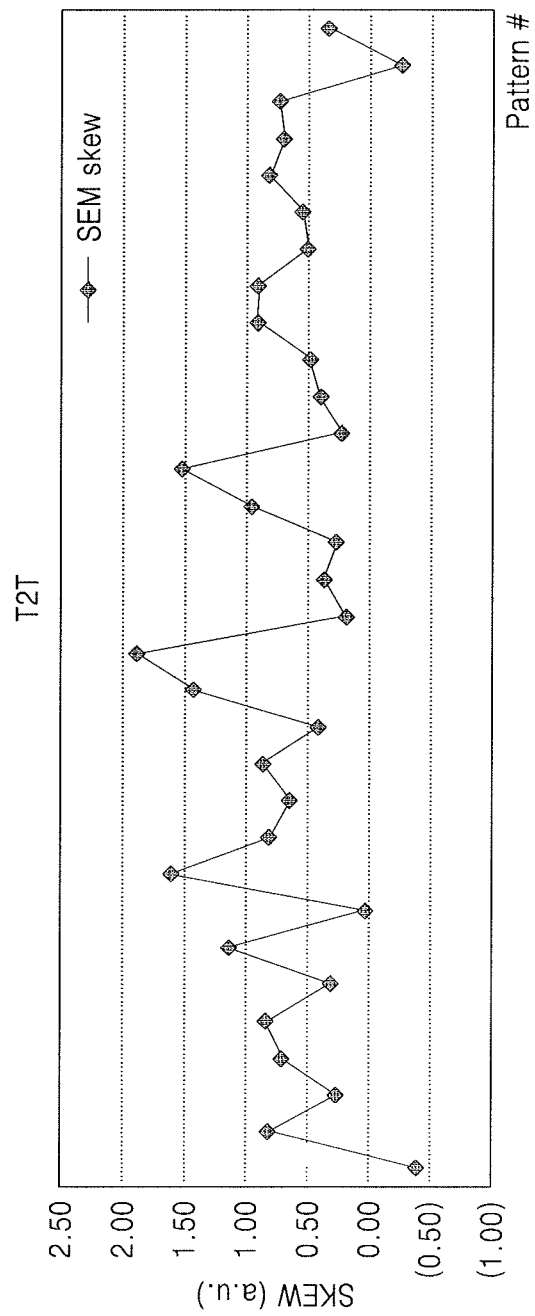
Figure 6C:
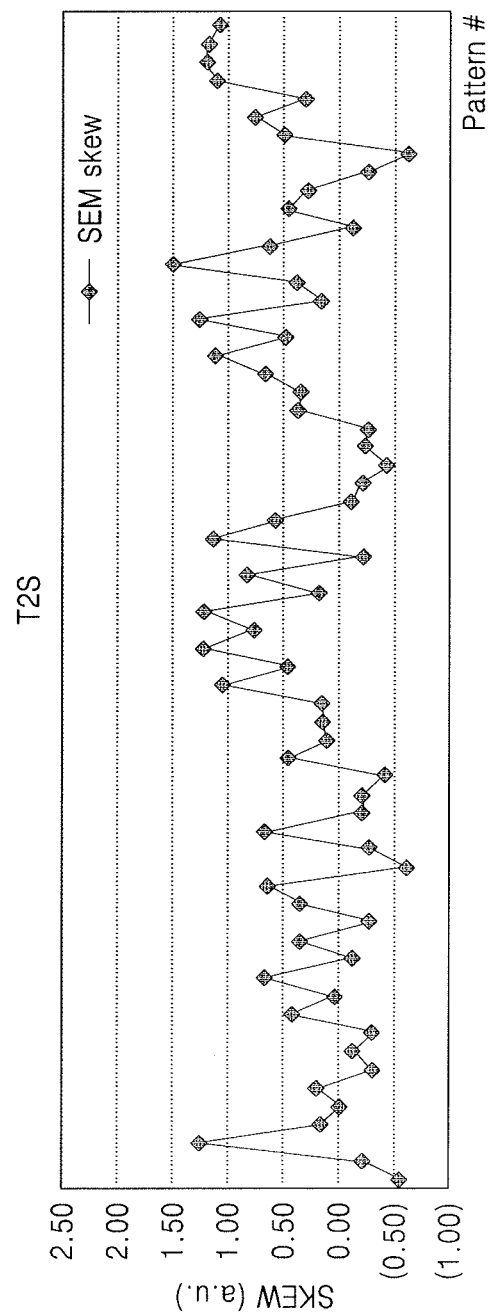
Figure 7A:
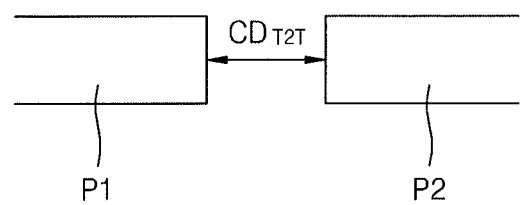
FIGS. 7A and 7B illustrate graphs of the concept of a T2T CD of FIG. 6B and the concept of a T2S CD of FIG. 6C, respectively.
Figure 7B:
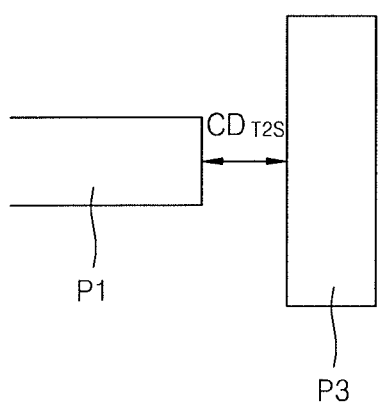

FIGS. 6A to 6C are graphs showing SEM skew data applied to the OPC method of FIG. 1 for various patterns, and FIGS. 7A and 7B are graphs showing the concept of a T2T CD of FIG. 6B and the concept of a T2S CD of FIG. 6C, respectively. Here, the x-axis represents the type of PR patterns, and the y-axis represents the degree of PR shrinking caused by SEM measurement. i.e. a SEM skew, which corresponds to $\Delta$ in Equation 1 described above and has an arbitrary unit. FIG. 6A reflects data corresponding to simple patterns, e.g., line-and-space patterns, denoted by 1D, FIG. 6B reflects data corresponding to patterns shown in FIG. 7A where T2T denotes a space between a tip of a pattern and a tip of an adjacent pattern, and FIG. 6C reflects data corresponding to patterns shown in FIG. 7B where T2S denotes a space between a tip of a pattern and a (e.g., lateral) side of an adjacent pattern. For reference, complex patterns are usually abbreviated as 2D. The PR patterns may include PR patterns arranged closely to each other and an independent pattern and may be basically arranged vertically.

Referring to FIG. 6A, it may be understood that the SEM skew data is repeated with a certain pattern because the PR patterns are repeatedly arranged with a certain rule. The fact that the SEM skew data has a certain pattern with respect to the repetitive PR patterns makes it possible to predict the accuracy of the ADI CD correction method for a PR pattern which is applied to the OPC method according to the present embodiment. The SEM skew data of the PR patterns gradually decreases in one repeated period, which may be caused by a density difference between the PR patterns. For example, when a PR pattern density is relatively low, i.e., when the PR patterns are roughly arranged, a SEM skew may be relatively large and when the PR pattern density is relatively high, i.e., when the PR patterns are closely arranged, the SEM skew may be relatively small.

Referring to FIGS. 6B and 7A, the graph of FIG. 6B shows SEM skew data for a T2T CD $CD_{T2T}$, i.e., a CD between a tip portion of a first pattern P1 and a tip portion of a second pattern P2, which is shown in FIG. 7A. More specifically, a CD between the tip portion of the first pattern P1 and the tip portion of the second pattern P2 may be measured by a SEM, and then $\Delta$ may be calculated through the above-described process to obtain the SEM skew data for the T2T CD $CD_{T2T}$. As shown in FIG. 6B, it may be understood that the SEM skew data of the T2T CD of PR patterns varies greatly.

Referring to FIGS. 6C and 7B, the graph of FIG. 6C shows SEM skew data for a T2S CD $CD_{T2S}$, i.e., a CD between a tip portion of a first pattern P1 and a side portion of a third pattern P3, which is shown in FIG. 7B. More specifically, a CD between the tip portion of the first pattern P1 and the side portion of the third pattern P3 may be measured by a SEM, and then $\Delta$ may be calculated through the above-described process to obtain the SEM skew data for the T2S CD $CD_{T2S}$. As shown in FIG. 6C, it may be understood that the SEM skew data of the T2S CD of PR patterns varies greatly.

Figure 8:
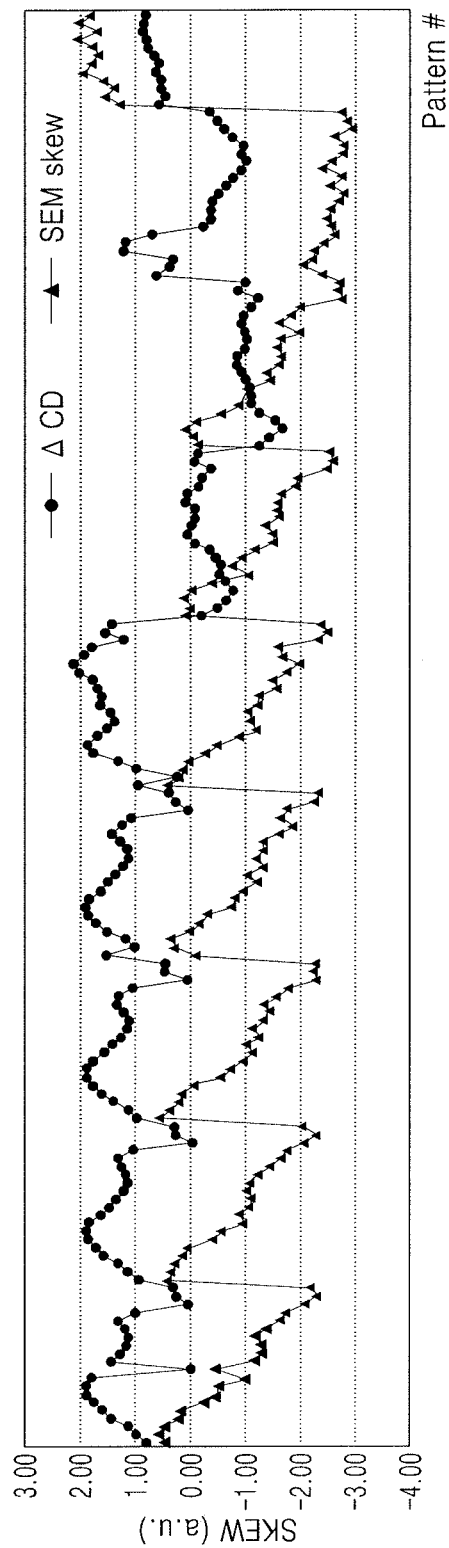
FIG. 8 illustrates a graph of ΔCD applied to an OPC model generated by a comparative method and SEM skew data applied to the OPC method of FIG. 1.

FIG. 8 is a graph showing $\Delta$CD applied to an OPC model generated by a comparative method and SEM skew data applied to the OPC method of FIG. 1. Here, the x-axis represents the type of PR patterns, and the y-axis represents $\Delta$CD and the SEM skew data, which have an arbitrary unit. The $\Delta$CD may correspond to a correction value empirically reflected by engineers for the correction of an ADI CD of a PR pattern measured by an SEM, in a comparative OPC modelling. The SEM skew data may be the same as the SEM skew data of FIG. 6A.

Referring to FIG. 8, it may be understood that $\Delta$CDs are irregular and have generally high values compared to the SEM skew data. Since the PR patterns are repetitive patterns, it may be expected that ADI CD correction for a PR pattern by using the SEM skew data is more accurate than ADI CD correction for a PR pattern by using the $\Delta$CDs. Thus, it may be understood that an OPC model based on the SEM skew data may contribute to performing a more accurate OPC method compared to an OPC model based on the $\Delta$CDs.

FIG. 9 is a table for comparing an OPC model generated by a comparative method with an OPC model generated by the OPC method of FIG. 1. Here, PTD denotes an OPC model generated by a comparative method, and SEM PTD denotes an OPC model generated by reflecting an SEM skew according to the OPC method of the present embodiment. In addition, 1D RMS represents an error RMS value for simple patterns, 2D RMS represents an error RMS value for complex patterns, and Overall RMS represents an error RMS value for all patterns. 1D Pass Rate represents the percentage of allowable simple patterns, 2D Pass Rate represents the percentage of allowable complex patterns, and Overall Pass Rate represents the percentage of all allowable patterns.

Referring to FIG. 9, the lower the 1D RMS, the 2D RMS, and the Overall RMS, the higher the performance of an OPC model. Also, the higher the 1D Pass Rate, the 2D Pass Rate, and the Overall Pass Rate, the higher the performance of an OPC model. As shown in the table of FIG. 9, the 1D RMS, the 2D RMS, and the Overall RMS of the SEM PTD are respectively lower than the 1D RMS, the 2D RMS, and the Overall RMS of the PTD. In addition, the 1D Pass Rate, the 2D Pass Rate, and the Overall Pass Rate of the SEM PTD are respectively higher than the 1D Pass Rate, the 2D Pass Rate, and the Overall Pass Rate of the PTD. Thus, it may be understood that the OPC model generated by reflecting a SEM skew according to the OPC method of the present embodiment is superior to the OPC model generated by the comparative method.

Figure 10:
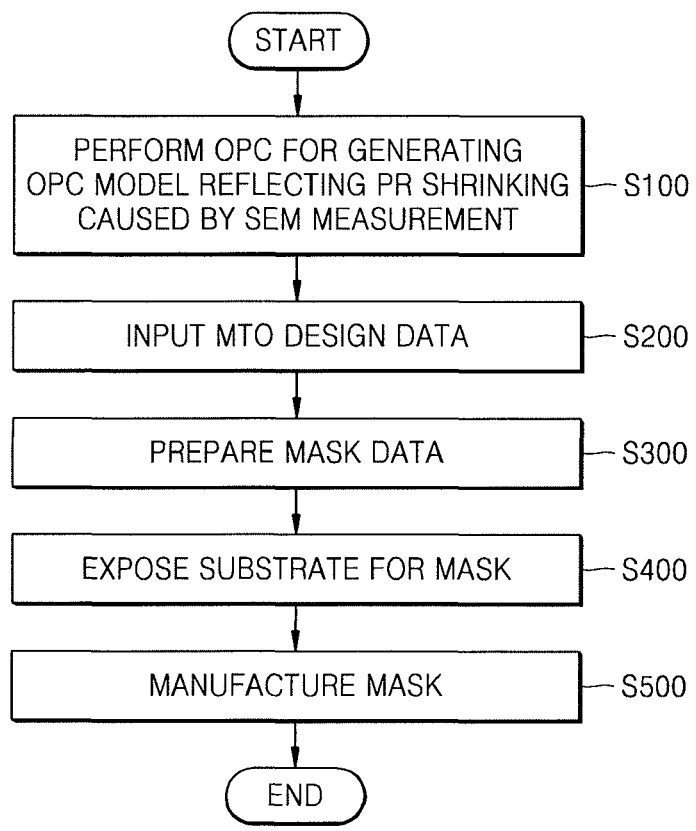
FIG. 10 illustrates a flowchart of a method of manufacturing a mask according to an embodiment.

FIG. 10 is a flowchart of a method of manufacturing a mask, according to an embodiment. Descriptions provided above with reference to FIGS. 1 to 5D will be only briefly described or omitted.

Referring to FIG. 10, first, OPC is performed (operation S100). The operation of performing the OPC may include the operation of preparing basic data (operation S110), the operation of generating CD data of a sample (operation S120), the operation of generating an OPC model (operations S130 and S140), the operation of checking and selecting the OPC model (operation S150), the operation of verifying the OPC model (operation S160), and the operation of performing a simulation (operation S170), as described with reference to FIG. 1. The operation of generating the CD data of the sample (operation S120) may include the operation of forming a PR pattern (operation S121), the operation of measuring an ADI CD of the PR pattern (operation S122), the operation of forming a wafer pattern (operation S123), the operation of measuring an ACI CD of the wafer pattern (operation S124), the operation of calculating a difference between first and second ACI CDs (operation S125), and the operation of correcting the ADI CD of the PR pattern by using the difference (operation S126), as described with reference to FIG. 4.

After performing the OPC, MTO design data is received (operation S200). In general, the MTO may denote transferring mask design data, for which the OPC is completed, to request a mask fabrication. Thus, the MTO design data may be referred to as mask design data for which the OPC is completed. The MTO design data may have a graphic data format used in electronic design automation (EDA) software. For example, the MTO design data may have a data format such as graphic data system II (GDS2) or open artwork system interchange standard (OASIS).

After receiving the MTO design data, a mask data preparation (MDP) is performed (operation S300). The MDP may include, for example, format conversion referred to as fracturing, augmentation of barcode for mechanical reading, a standard mask pattern for test, job deck, and the like, and automatic or manual verification. The job deck may denote generation of a text file about a series of commands such as arrangement information of multiple mask files, a reference dose, the exposure speed or the exposure type.

The format conversion, that is, the fracturing, may denote a process of dividing the MTO design data according to regions and converting the format of the MTO design data into a format for an electron beam exposure device. The fracturing may include data manipulation, for example, scaling, sizing of data, rotating of data, pattern reflection, and color reversal. During a conversion process through the fracturing, data about a lot of systematic errors that may occur during transferring of images from design data onto a wafer may be corrected. The process of correcting data about the systematic errors may be referred to as a mask process correction (MPC), and may include, for example, a line width adjustment referred to as a CD adjustment and an operation of improving accuracy in the pattern arrangement. Thus, the fracturing may contribute to improving mask quality, and may be performed in advance to correct a mask process. Here, the systematic errors may be caused by distortions generated in an exposure process, mask development and etching processes, and a wafer imaging process.

The MDP may include the MPC. As described above, the MPC denotes a process of correcting an error generated during an exposure process, that is, a systematic error. Here, the exposure process may include overall operations such as electron beam writing, development, etching, and baking processes. A data processing may be performed before the exposure process. The data processing is a pre-process of mask data, and may include grammar check of the mask data and prediction of an exposure time.

After preparing the mask data, a substrate for mask is exposed based on the mask data (operation S400). Here, the exposure may denote, for example, an electron beam writing operation. The electron beam writing operation may be performed in a gray writing manner using a multi-beam mask writer (MBMW). Also, the electron beam writing operation may be performed by using a variable shape beam (VSB) exposure device.

In addition, after the preparing of the mask data and before the exposure process, a process of converting the mask data into pixel data may be performed. The pixel data is directly used in an actual exposure process, and may include data about a shape that is to be exposed and data about a dose assigned to the shape. Here, the data about the shape may be bit-map data converted from shape data, which is vector data, through rasterization.

After the exposure process, the mask is manufactured by performing a series of processes (operation S500). The series of processes may include, for example, development, etching, and cleansing processes. Also, the series of processes for manufacturing the mask may include a measurement process, a defect inspection process, or a defect repair process. Also, the series of processes may include a pellicle coating process. The pellicle coating process may denote a process of attaching a pellicle for protecting the mask against follow-up contamination during delivery of the mask and an available lifespan of the mask, if it is identified that there are no contamination particles or chemical spots on the mask through final cleansing and test processes.

In the method of manufacturing a mask according to the present embodiment, as described with reference to FIG. 1, CD data of a sample reflecting PR shrinking caused by SEM measurement may be generated and the accuracy of an OPC model may be improved using the CD data of the sample in OPC modelling, and thus, an excellent mask may be manufactured by optimizing an OPC method. For example, the method of manufacturing a mask according to the present embodiment makes it possible to manufacture a mask with reduced errors due to PR shrinking caused by SEM measurement.

Figure 11:
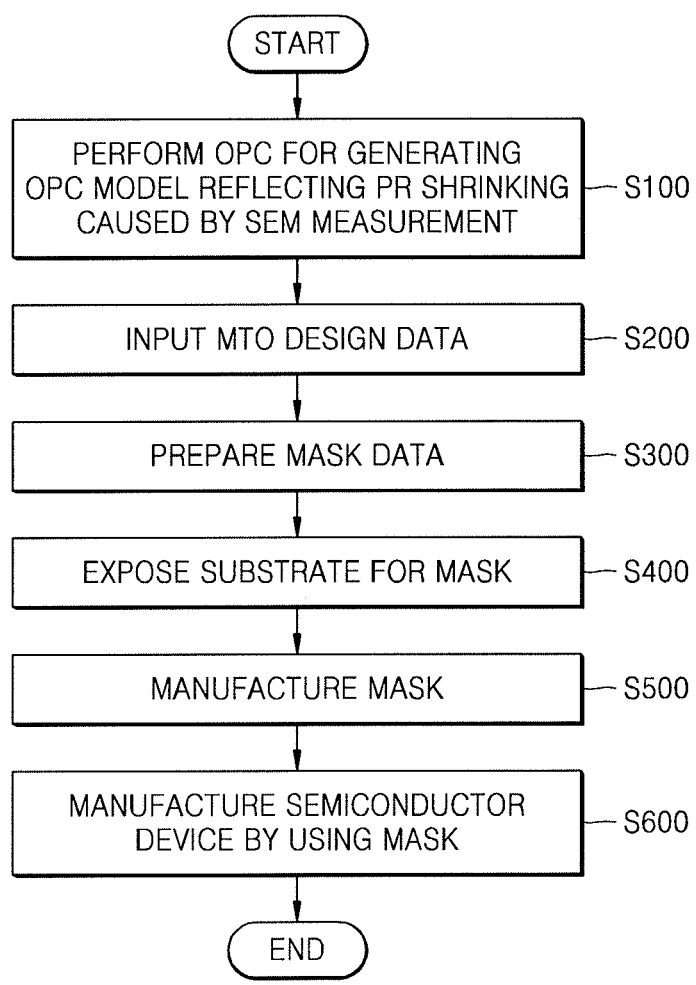
FIG. 11 illustrates a flowchart of a method of manufacturing a semiconductor device according to an embodiment.

FIG. 11 is a flowchart of a method of manufacturing a semiconductor device, according to an embodiment. Descriptions already provided above with reference to FIG. 10 will be only briefly described or omitted.

Referring to FIG. 11, performing OPC (operation S100), inputting MTO design data (operation S200), preparing mask data (operation S300), exposing a substrate for a mask (operation S400), and manufacturing the mask (operation S500) are performed to manufacture the mask, as described with reference to FIG. 10.

When the mask is manufactured, various semiconductor processes may be performed on a semiconductor substrate such as a wafer by using the mask to manufacture a semiconductor device (operation S600). For example, the process using the mask may be a patterning process using an exposure process. A desired pattern may be formed on the semiconductor substrate or a material layer through the patterning process using the mask.

The semiconductor processes may include a deposition process, an etching process, an ionization process, and a cleaning process. The deposition process may include various material layer forming processes such as chemical vapor deposition (CVD), sputtering, and spin coating. The ionization process may include processes such as ion implantation, diffusion, and thermal treatment. In addition, the semiconductor processes may include a packaging process for mounting a semiconductor device on a printed circuit board (PCB) and sealing the semiconductor device by using a sealing material, and may include a test process for testing the semiconductor device or a semiconductor package.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

By way of summation and review, embodiments provide an optical proximity correction (OPC) method capable of generating an OPC model with high accuracy. That is, according to the method of manufacturing a semiconductor device according to the present embodiment, CD data of a sample reflecting PR shrinking caused by SEM measurement may be generated and the accuracy of an OPC model may be improved using the CD data of the sample in OPC modelling. Accordingly, an excellent mask may be manufactured by optimizing an OPC method. In addition, by performing an exposure process and other semiconductor processes by using the mask, it is possible to produce semiconductor devices with reduced defects. Thus, the semiconductor device manufacturing method according to the present embodiment may remarkably increase a semiconductor process yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An optical proximity correction (OPC) method, comprising:
preparing basic data for OPC;
forming a photoresist (PR) pattern on a wafer;
measuring with a scanning electron microscope (SEM) an after development inspection (ADI) critical dimension (CD) of a the formed PR pattern with respect to a sample;
etching the wafer by using the formed PR pattern to form a wafer pattern;
measuring with the SEM an after cleaning inspection (ACI) CD of the formed wafer pattern;
generating CD data of the sample reflecting PR shrinking caused by the SEM measurement by using the ADI CD of the PR pattern and the ACI CD of the wafer pattern;
generating an OPC model based on the basic data and the CD data of the sample; and
using the OPC model to design dimensions of a desired pattern to form the desired pattern on a substrate.

2. The OPC method as claimed in claim 1, wherein generating the CD data of the sample includes correcting the ADI CD of the PR pattern using the ACI CD of the wafer pattern, such that the CD data of the sample is generated based on the corrected ADI CD of the PR pattern.

3. The OPC method as claimed in claim 2, wherein:
the ACI CD of the wafer pattern includes a first ACI CD of the wafer pattern formed using a PR pattern in which an ADI CD has been measured by using the SEM, and a second ACI CD of the wafer pattern formed using a PR pattern in which an ADI CD has not been measured by using the SEM, and
the ADI CD of the PR pattern is corrected using a difference between the first ACI CD and the second ACI CD.

4. The OPC method as claimed in claim 1, wherein generating the CD data of the sample includes:
measuring the ADI CD of the PR pattern in a first area of the sample by using the SEM;
measuring, by using the SEM, a first ACI CD of the wafer pattern corresponding to the PR pattern in the first area, and measuring a second ACI CD of the wafer pattern in a second area different from the first area;
calculating a difference between the first ACI CD and the second ACI CD by comparing the first ACI CD with the second ACI CD; and
correcting the ADI CD of the PR pattern based on the difference.

5. The OPC method as claimed in claim 4, wherein calculating the difference between the first and second ACI CDs includes comparing the first ACI CD and the second ACI CD for wafer patterns having a substantially same form.

6. The OPC method as claimed in claim 4, wherein:
the second area includes wafer patterns having a substantially same form as those of the first area,
measuring the first ACI CD of the wafer pattern includes measuring a first ACI CD of each of the wafer patterns in the first area at ten or more locations in the first area, and
measuring the second ACI CD of the wafer pattern includes measuring a second ACI CD of the each of the wafer patterns in the second area at locations in the second area corresponding to the ten or more locations in the first area.

7. The OPC method as claimed in claim 4, wherein the ADI CD (CD_ad) of the PR pattern before correction, the first ACI CD (CD_ac1), the second ACI CD (CD_ac2), and the ADI CD (CD_co) of the PR pattern after correction satisfy Equation 1 below, $$CD\_co = CD\_ad + \Delta \qquad \text{Equation 1,}$$

wherein $\Delta = CD\_ac2 - CD\_ac1$.

8. The OPC method as claimed in claim 1, wherein generating the OPC model includes:
generating an optical OPC model; and
generating an OPC model for the PR.

9. The OPC method as claimed in claim 1, further comprising, after generating the OPC model:
checking and selecting the OPC model;
verifying the OPC model; and
performing a simulation by using the OPC model,
wherein checking the OPC model is performed by calculating a root mean square (RMS) of a CD error, and if the OPC model is not within a set criterion, generating the OPC model is performed again, and
wherein verifying the OPC model is performed by applying the OPC model to another pattern, and if a substantially same result is not obtained for the other pattern, generating the OPC model is performed again.

10. An optical proximity correction (OPC) method, comprising:
preparing basic data for OPC;
forming a photoresist (PR) pattern on a wafer;
measuring with a scanning electron microscope (SEM) an after development inspection (ADI) critical dimension (CD) of the formed PR pattern with respect to a sample;
etching the wafer by using the formed PR pattern to form a wafer pattern;
measuring with the SEM an after cleaning inspection (ACI) CD of a wafer pattern;
correcting the ADI CD of the PR pattern by using the ACI CD of the wafer pattern to generate CD data of the sample;
generating an OPC model based on the basic data and the CD data of the sample;
checking and selecting the OPC model;
verifying the OPC model; and
using the OPC model to design dimensions of a desired pattern to form the desired pattern on a substrate.

11. The OPC method as claimed in claim 10, wherein measuring the ADI CD of the PR pattern and the ACI CD of the wafer pattern includes:
measuring the ADI CD of the PR pattern in a first area of the sample by using the SEM; and
measuring, by using the SEM, a first ACI CD of the wafer pattern corresponding to the PR pattern in the first area and measuring a second ACI CD of the wafer pattern in a second area different from the first area.

12. The OPC method as claimed in claim 11, wherein:
the second area includes wafer patterns having substantially same form as those of the first area,
measuring the first ACI CD of the wafer pattern, includes measuring a first ACI CD of each of the wafer patterns in the first area at ten or more locations in the first area, and
measuring the second ACI CD of the wafer pattern includes measuring a second ACI CD of each of the wafer patterns in the second area at locations in the second area corresponding to the ten or more locations in the first area.

13. The OPC method as claimed in claim 11, wherein correcting the ADI CD of the PR pattern is performed by using a difference between the first ACI CD and the second ACI CD.

14. The OPC method as claimed in claim 11, wherein correcting the ADI CD of the PR pattern is performed according to equation (2) below, $$CD\_co = CD\_ad + \Delta \qquad (2),$$

where $\Delta = CD)\_ac2 - CD\_ac1$, CD_ad is the ADI CD of the PR pattern before correction, CD_ac1 is the first ACI CD CD_ac2 is the second ACI CD, and CD_co is the ADI CD of the PR pattern after correction.

15. A method of manufacturing a mask, the method comprising:
performing an optical proximity correction (OPC) method including:
forming a photoresist (PR) pattern on a wafer,
measuring with a scanning electron microscope (SEM) an after development inspection (ADI) critical dimension (CD) of the formed PR pattern with respect to a sample,
etching the wafer by using the formed PR pattern to form a wafer pattern,
measuring with the SEM an after cleaning inspection (ACI) CD of the formed wafer pattern, and
generating an OPC model reflecting PR shrinking caused by SEM measurement by using the ADI CD of the PR pattern and the ACI CD of the wafer pattern;
delivering design data acquired through the OPC method as mask tape-out (MTO) design data;
preparing mask data based on the MTO design data; and
performing exposure on a substrate for a mask, based on the mask data.

16. The method as claimed in claim 15, wherein performing the OPC method includes:
preparing basic data for OPC;
measuring, by using the SEM, the ADI CD of the PR pattern and the ACI CD of the wafer pattern with respect to the sample;
correcting the ADI CD of the PR pattern by using the ACI CD of the wafer pattern to generate CD data of the sample; and
generating an OPC model based on the basic data and the CD data of the sample.

17. The method as claimed in claim 16, wherein measuring the ADI CD of the PR pattern and the ACI CD of the wafer pattern includes:
measuring the ADI CD of the PR pattern in a first area of the sample by using the SEM;
etching a wafer by using the PR pattern to generate the wafer pattern; and
measuring, by using the SEM, a first ACI CD of the wafer pattern corresponding to the PR pattern in the first area and measuring a second ACI CD of the wafer pattern in a second area different from the first area.

18. The method as claimed in claim 17, wherein:
the second area includes wafer patterns having substantially same form as those of the first area,
measuring the first ACI CD of the wafer pattern includes measuring a first ACI CD of each of the wafer patterns in the first area at ten or more locations in the first area, and
measuring the second ACI CD of the wafer pattern includes measuring a second ACI CD of each of the wafer patterns in the second area at locations in the second area corresponding to the ten or more locations in the first area.

19. The method as claimed in claim 17, wherein correcting the ADI CD of the PR pattern is performed using equation (3), $$CD\_co = CD\_ad + \Delta \qquad (3),$$

where $\Delta = CD\_ac2 - CD\_ac1$, CD_ad is the ADI CD of the PR pattern before correction, CD_ac1 is the first ACI CD, CD_ac2 is the second ACI CD, and CD_co is the ADI CD of the PR pattern after correction.

20. The method as claimed in claim 16, wherein generating the OPC model includes:
   generating an optical OPC model; and
   generating an OPC model for the PR, and
   the OPC method further comprises, after generating the OPC model:
      checking and selecting the OPC model;
      verifying the OPC model; and
      performing a simulation by using the OPC model.

* * * * *